United States Patent
Chang et al.

(10) Patent No.: US 8,293,639 B2
(45) Date of Patent: *Oct. 23, 2012

(54) METHOD FOR CONTROLLING ADI-AEI CD DIFFERENCE RATIO OF OPENINGS HAVING DIFFERENT SIZES

(75) Inventors: Feng-Yih Chang, Chiayi County (TW);
Pei-Yu Chou, Tainan County (TW);
Jiunn-Hsiung Liao, Tainan County (TW); Chih-Wen Feng, Tainan County (TW); Ying-Chih Lin, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 830 days.

This patent is subject to a terminal disclaimer.

(21) Appl. No.: 12/371,809

(22) Filed: Feb. 16, 2009

(65) Prior Publication Data

US 2009/0145877 A1 Jun. 11, 2009

Related U.S. Application Data

(63) Continuation-in-part of application No. 11/877,918, filed on Oct. 24, 2007, now Pat. No. 8,101,092.

(51) Int. Cl.
*H01L 21/4763* (2006.01)

(52) U.S. Cl. ............. 438/637; 216/46; 216/49; 216/67; 216/72; 438/275; 438/639; 438/640; 438/673

(58) Field of Classification Search .................... 216/46, 216/49, 67, 72; 438/275, 637, 638, 640, 438/673

See application file for complete search history.

(56) References Cited

U.S. PATENT DOCUMENTS

| | | | |
|---|---|---|---|
| 4,891,303 A | 1/1990 | Garza et al. | 430/312 |
| 6,251,791 B1 | 6/2001 | Tsai et al. | 438/700 |
| 6,287,951 B1 * | 9/2001 | Lucas et al. | 438/618 |
| 6,887,649 B2 | 5/2005 | Otoguro et al. | 430/272.1 |
| 7,319,067 B2 * | 1/2008 | Chou et al. | 438/637 |
| 7,544,623 B2 | 6/2009 | Chou et al. | 438/736 |
| 2006/0046483 A1 * | 3/2006 | Abatchev et al. | 438/689 |
| 2007/0281491 A1 * | 12/2007 | Kamp | 438/717 |
| 2009/0107954 A1 * | 4/2009 | Feng et al. | 216/51 |

OTHER PUBLICATIONS

Document A—Chou, Pei Yu et al., "Novel Trilayer CONT etching for 45nm and beyond" UMC Invention Disclosure documents, pp. 1-8.
Document B—Feng, Vincent, UMC research data, May 22, 2007.

* cited by examiner

*Primary Examiner* — Nadine Norton
*Assistant Examiner* — Christopher Remavege
(74) *Attorney, Agent, or Firm* — J.C. Patents

(57) ABSTRACT

A method for controlling an ADI-AEI CD difference ratio of openings having different sizes is described. The openings are formed through a silicon-containing material layer, an etching resistive layer and a target material layer in turn. Before the opening etching steps, at least one of the opening patterns in the photoresist mask is altered in size through photoresist trimming or deposition of a substantially conformal polymer layer. A first etching step forming thicker polymer on the sidewall of the wider opening pattern is performed to form a patterned Si-containing material layer. A second etching step is performed to remove exposed portions of the etching resistive layer and the target material layer. At least one parameter among the parameters of the photoresist trimming or polymer layer deposition step and the etching parameters of the first etching step is controlled to obtain a predetermined ADI-AEI CD difference ratio.

20 Claims, 8 Drawing Sheets

METHOD FOR CONTROLLING ADI-AEI CD DIFFERENCE RATIO OF OPENINGS HAVING DIFFERENT SIZES

CROSS-REFERENCE TO RELATED APPLICATION

This application is a continuation-in-part of a prior application Ser. No. 11/877,918, filed on Oct. 24, 2007, now pending. The entirety of the above-mentioned patent applications is hereby incorporated by reference herein and made a part of this specification.

BACKGROUND OF THE INVENTION

1. Field of the Invention

The present invention is related to etching techniques, and particularly to a method of controlling ADI-AEI CD difference ratio of openings having different sizes.

2. Description of Related Art

As the requirement of integration level in the integrated circuits gets higher, the dimensions of the circuit pattern gets smaller as well. In the fabricating process of the integrated circuits, the method of reducing the size of patterns mostly utilizes a photolithographic process having high resolution. However, a high-resolution photolithographic process has its optical limitations. Therefore, the technology is very difficult and the fabricating cost thereof is very expensive. Especially for the fabricating process of opening patterns, an after-development-inspection critical dimension (ADI CD) solely related to the photolithographic process is particularly difficult to control. Hence, an after-etching-inspection critical dimension (AEI CD) required by the fabricating process would generally be obtained by adjusting etching recipes. The AEI CD is the size of an opening actually formed in the target material layer.

When openings having different sizes are simultaneously formed in this method, however, the problem that an ADI-AEI CD difference ratio of each of the openings is difficult to properly control still remains. Herein, the so-called "ADI-AEI CD ratio" is defined as: the difference between an after-development-inspection critical dimension and an after-etching-inspection critical dimension. For example, in a process of forming simultaneously a square contact in contact with a source/drain and a share contact in contact with a gate and a source/drain, if a size of the square contact opening is reduced, a size of the larger share contact opening would be reduced even more. When the size of the share contact opening is overly reduced, the share contact subsequently formed would have a resistance so high that an operational speed is greatly lowered. The share contact may even not be able to contact a target gate or a target source/drain region and thereby resulting in a short circuit. In contrast, if sizes of the square/share contact openings are insufficiently reduced, a problem of mistakenly contacting with other elements would occur. Therefore, ranges of size reduction for the two contact openings should both be adequately controlled.

Similarly, in other kinds of opening processes, when various kinds of openings having different sizes need to be formed simultaneously, a range of ADI-AEI CD difference ratio for each type of the openings also needs to be properly controlled simultaneously so as to comply with a range allowed by the fabricating process.

SUMMARY OF THE INVENTION

In view of the aforementioned, the present invention provides a method of controlling ADI-AEI CD difference ratios of openings having different sizes.

The present invention provides a method of controlling ADI-AEI difference ratio of openings having different sizes. A process of fabricating openings having different sizes includes first forming a third-layer structure containing an etching resistive layer, a silicon-containing (Si-containing) material layer and a photoresist layer on a target material layer in sequence, and patterning the photoresist layer in order to form a patterned photoresist layer. The patterned photoresist layer has a first opening pattern and a second opening pattern having different sizes. Afterwards, steps of etching the Si-containing material layer, the etching resistive layer and the target material layer are performed in sequence to respectively form a first opening and a second opening corresponding to the first opening pattern and the second opening pattern in the target material layer. A difference between a size of the first opening, namely an after-etching-inspection critical dimension (AEI CD) of the first opening, and a size of the first opening pattern, namely an after-development-inspection critical dimension (ADI CD) of the first opening, is a first dimension difference. A difference between a size of the second opening, namely an AEI CD of the second opening, and a size of the second opening pattern, namely an ADI CD of the second opening, is a second dimension difference. A ratio of the second dimension difference to the first dimension difference is called an AEI-ADI difference ratio. And, the size of the first opening pattern is larger than that of the second opening pattern. The controlling method is characterized by that a first etching step is performed by using the patterned photoresist layer as the mask to transfer the patterns of the patterned photoresist layer to the Si-containing material layer so as to form a patterned Si-containing material layer and generate a polymer layer on sidewalls of the patterned photoresist layer and the patterned Si-containing material layer. Next, a second etching step is performed by using the patterned photoresist layer, the patterned Si-containing material layer and the polymer layer as masks so as to at least remove an exposed portion of the etching resistive layer and form a patterned etching resistive layer. After that, the patterned etching resistive layer is utilized as an etching mask to remove a portion of the target material layer and form the first and second openings in the target material layer. Further, a predetermined ADI-AEI CD difference ratio is thus obtained by adjusting etching parameters of the first etching step and/ or etching parameters of the second etching step.

According to the method of controlling the AEI-ADI CD difference ratios of openings having different sizes, the second etching step is performing an over-etching step so as to form an expanded opening pattern of the second opening in the patterned etching resistive layer. The second etching stop is to conduct a fluorinated hydrocarbon served as an etching gas and the fluorinated hydrocarbon compound is CHxFy, wherein x=1, 2, 3 and y=1, 2, 3.

According to the method of controlling the AEI-ADI CD difference ratios of openings having different sizes, the second etching step is performing a just-etching step so as to form a substantially perpendicular opening pattern in the patterned etching resistive layer. In one embodiment, the etching gas used in the second etching step is, for example, $CF_4$, CO and $O_2$.

According to the method of controlling the AEI-ADI CD difference ratios of openings having different sizes, the second etching step is performing, for example, an under-etching step to remove an exposed portion of the etching resistive layer, wherein the etching gas used in the second etching step is, for example, $CF_4$, CO and $O_2$. Then, a third etching step which is an over-etching step is further performed to remove the residual etching resistive layer and a portion of the target material layer thereunder. The over-etching step is an anisotropic etching step. An etching gas utilized by the over-etching step is a fluorinated gas.

According to the method of controlling the AEI-ADI CD difference ratios of openings having different sizes, the fluorinated hydrocarbon compound is CHxFy, and x=1, 2, 3; y=1, 2, 3.

According to the method of controlling the AEI-ADI CD difference ratios of openings having different sizes, an etching parameter of the first etching step is, for example, a flow rate of the etching gas.

According to the method of controlling the AEI-ADI CD difference ratios of openings having different sizes, an etching parameter of the first etching step is, for example, an etching time.

According to the method of controlling the AEI-ADI CD difference ratios of openings having different sizes, the size of the first opening pattern is larger than that of the second opening pattern. At the moment, the first opening is a share contact opening, and the second opening is a square contact opening.

According to the method of controlling the AEI-ADI CD difference ratios of openings having different sizes, the etching resistive layer is, for example, an I-line photoresist.

According to the method of controlling the AEI-ADI CD difference ratios of openings having different sizes, the Si-containing material layer is, for example, silicon-containing hard-mask bottom anti-reflection coating (SHB) layer.

According to the method of controlling the AEI-ADI CD difference ratios of openings having different sizes, the patterned photoresist layer is, for example, a 193 nanometer photoresist.

According to the method of controlling the AEI-ADI CD difference ratios of openings having different sizes, the target material layer includes a dielectric layer.

The method of the present invention controls the AEI-ADI CD difference ratios of openings having different sizes within a range allowed by the fabricating process by adjusting the etching parameters of the steps of etching the Si-containing material layer and etching the etching resistive layer. Therefore, the present invention can avoid the problems of mismatching, too small contact areas with elements or no contact with elements in the subsequently formed contacts and thereby greatly improving the reliability of the fabricating process. In another aspect, the method of the present invention controls AEI-ADI CD difference ratios by adjusting the etching parameters of the etching processes without amending the photomasks and thereby reducing the fabricating cost.

In another embodiment of the method of controlling the ADI-AEI difference ratio of openings having different sizes, a trimming step is performed to the patterned photoresist layer before the steps of etching the Si-containing material layer, the etching resistive layer and the target material layer. A first etching step is performed using the trimmed photoresist layer as a mask to pattern the Si-containing material layer and form a patterned Si-containing material layer, wherein a polymer layer is formed on the sidewalls of the trimmed photoresist layer and the patterned Si-containing material layer. A second etching step is performed using the trimmed photoresist layer, the patterned Si-containing material layer and the polymer layer as masks to remove the exposed portions of the etching resistive layer and the target material layer. In this process, at least one parameter among the trimming parameters of the trimming step and etching parameters of the first etching step is adjusted to obtain a predetermined ADI-AEI CD difference ratio.

In the above embodiment, it is possible that at least one trimming parameter is adjusted and the at least one trimming parameter includes the trimmed amount of the photoresist.

In still another embodiment of the method of controlling ADI-AEI difference ratio of openings having different sizes, a substantially conformal first polymer layer is deposited over the patterned photoresist layer and in the first and the second opening patterns before the steps of etching the Si-containing material layer, the etching resistive layer and the target material layer. A first etching step is performed using the patterned photoresist layer and the first polymer layer on the sidewalls of the first and the second opening patterns as masks, so as to pattern the Si-containing material layer and form a patterned Si-containing material layer, wherein a second polymer layer is formed on the sidewalls of the first polymer layer and the patterned Si-containing material layer. A second etching step is performed using the patterned photoresist layer, the first polymer layer, the patterned Si-containing material layer and the second polymer layer as masks, so as to remove exposed portions of the etching resistive layer and the target material layer. In the above process, at least one parameter among the deposition parameters of the step of depositing the first polymer layer and the etching parameters of the first etching step is adjusted to obtain a predetermined ADI-AEI CD difference ratio.

In the above embodiment, it is possible that at least one deposition parameter is adjusted and the at least one deposition parameter includes the thickness of the first polymer layer.

In the former one of the above two embodiments of the invention, the sidewall photoresist of the wider (first) opening pattern is trimmed more than that of the narrower (second) one, such that the first dimension difference is decreased more than the second dimension difference so that the ADI-AEI CD difference ratio is decreased, as compared to the case without photoresist trimming. Moreover, by adjusting the trimmed amount of the photoresist, the decrease in the ADI-AEI CD difference ratio can be controlled.

In the latter one of the above embodiments, the wider (first) opening pattern is shrunk even more in the first etching step due to the presence of the first polymer layer, so that the first dimension difference is increased and the ADI-AEI CD difference ratio is increase, as compared to the case without polymer layer deposition before the etching. Moreover, by adjusting the thickness of the first polymer layer, the increase in the ADI-AEI CD difference ratio can be controlled.

In order to the make the aforementioned and other objects, features and advantages of the present invention more comprehensible, preferred embodiments accompanied with figures are described in detail below.

DESCRIPTION OF EMBODIMENTS

A fabricating process of contact openings is used as an example in the following to further illustrate the present invention, which is not intended to limit the scope of the present invention. FIGS. 1A through 1H are cross-sectional views illustrating a fabricating process flowchart of contact openings according to the present embodiment. The fabricating process of the contact openings includes a controlling method of AEI-ADI CD difference ratio in the present invention.

Figure 1A:
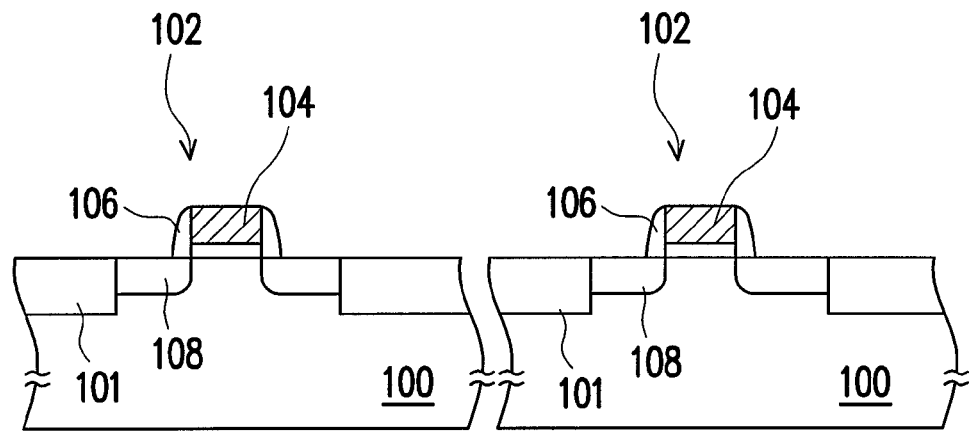
FIGS. 1A through 1H are cross-sectional views illustrating a fabricating process flowchart of contact openings according to an embodiment of the present invention. The fabricating process of the contact openings includes the controlling method of the AEI-ADI CD difference ratio in the present invention.

Referring to FIG. 1A, a substrate 100 is provided first. A plurality of metal oxide semiconductor (MOS) transistors 102 have been formed on the substrate 100. The MOS transistors 102 are isolated from the other elements with a shallow trench isolation structure, such as an isolation structure 101. A gate structure 104 of the MOS transistor 102 is disposed on the substrate 100. A spacer 106 is disposed on a sidewall of the gate structure 104, and a source/drain region 108 is disposed at two sides of the gate structure 104 in the substrate 100. In some embodiments, a metal silicide (not illustrated) may be further disposed on the gate 104 and the S/D region 108, such as nickel silicide, tungsten silicide or cobalt silicide, so that resistance is reduced. Since a material and a forming method of each of the elements in the MOS transistor 102 are well-known to people of ordinary skill in the art, they are not to be reiterated herein.

Figure 1B:
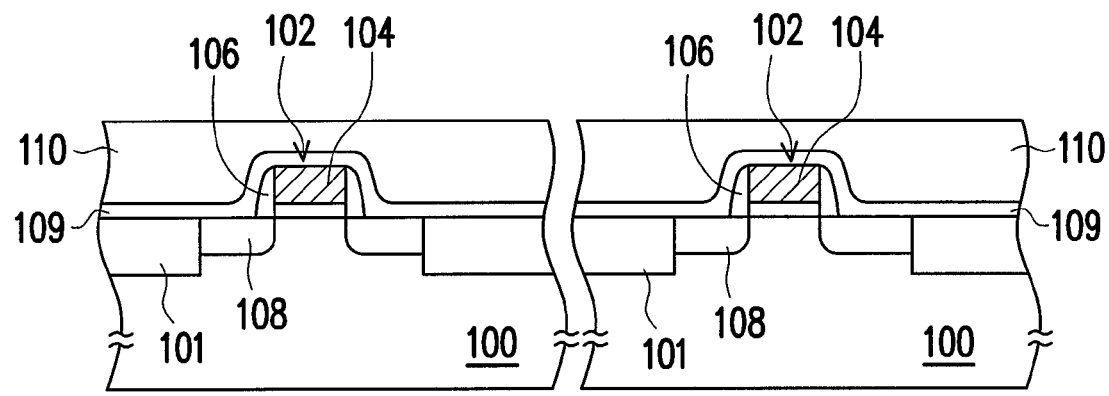

Afterwards, referring to FIG. 1B, a dielectric layer 110 is formed on the substrate 100 to cover the MOS transistor 102 and the isolation structure 101. The dielectric layer 110 is, for example, doped glass, silicon oxide ($SiO_2$) or a low dielectric constant material, or is constituted by an undoped silicate glass (USG) layer and a phospho-silicate glass (PSG) layer. A method of forming the dielectric layer 110 is, for example, a chemical vapor deposition (CVD) process or a spin-coating process. In the present embodiment, the dielectric layer 110 serves as a target material layer for pre-forming contact openings.

In some embodiments, before the dielectric layer 110 is formed, a contact etching stopper layer (CESL) 109 may be further formed on the substrate 100. A material of the CESL 109 may be silicon nitride, and a forming method of the CESL 109 may be a CVD process, for example. The target material layer refers exactly to the dielectric layer 110 and the CESL 109.

Next, an etching mask is formed on the dielectric layer 110 for subsequent steps of etching the contact openings. Currently, in advanced fabricating processes under 65 nm or 45 nm, a thickness of a photoresist needs to be further reduced or made thinner so as to mitigate a problem of poor uniformity in layer thickness derived from optical limitations of lithographic processes. However, the thinning of the photo-resistance would deteriorate an etching-resistant quality. Hence, multiple layers are usually adopted to substitute for a conventional single layer of photoresist as the etching mask.

Figure 1C:
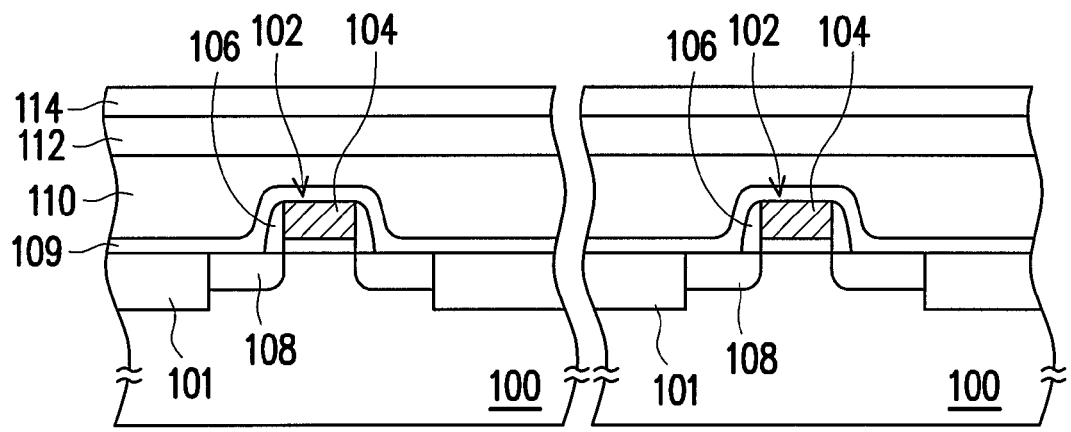

Referring to FIG. 1C, an etching resistive layer 112 is formed on the dielectric layer 110. The etching resistive layer 112 is fabricated using a material such as novolac resin or a material similar to an I-line photoresist. A thickness of the etching resistive layer 112 is about 1500 to 3000 angstroms, preferably about 1800 angstroms. If the etching resistive layer 112 is an I-line photoresist, a forming method thereof includes first performing a general photoresist coating procedure on the dielectric layer 110 and then performing a baking process to solidify the coating.

Afterwards, a Si-containing material layer 114 is formed on the etching resistive layer 112. The Si-containing material layer 114 is, for example, a silicon-containing hard-mask bottom anti-reflection coating (SHB) layer, and components thereof are organosilicon polymers or polysilanes, at least having one chromophore group and one crosslinkable group. In addition, the components of the Si-containing material layer 114 may also include a crosslinking agent so as to generate a crosslinking effect after irradiation. Furthermore, the Si-containing material layer 114 is characterized by different etching-resistant capacities obtained from adjusting an amount of silicon in the Si-containing material layer 114. In view of the aforementioned, the amount of silicon in the Si-containing material layer 114 is about 5 wt % to 30 wt %, preferably between 15 wt % to 25 wt %. A thickness thereof is between 150 angstroms to 1100 angstroms, preferably about 800 angstroms.

Figure 1D:
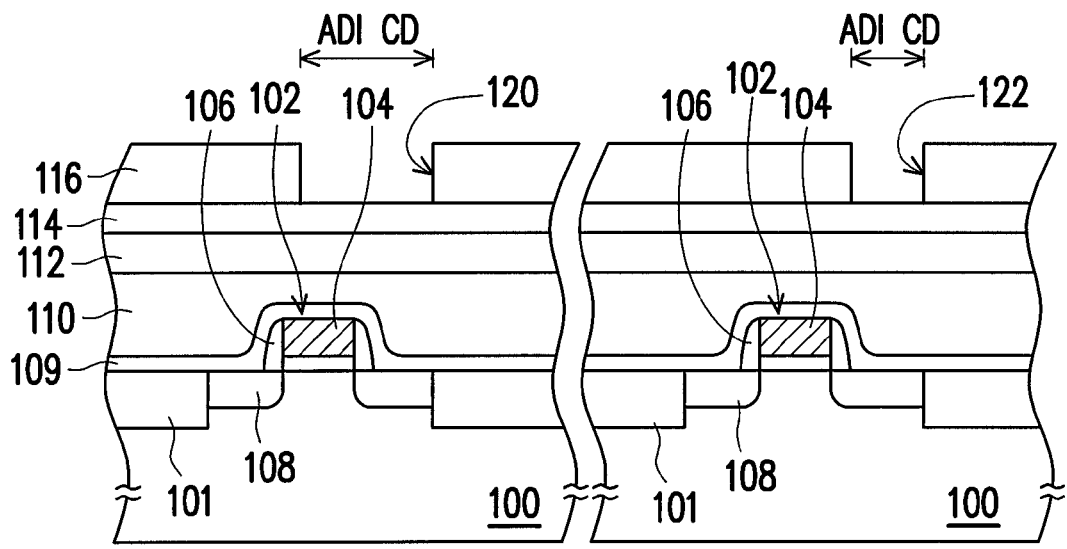

Then, referring to FIG. 1D, a patterned photoresist layer 116 is formed on the Si-containing material layer 114. The patterned photoresist layer 116 is an ArF photoresist or a 193 nanometer photoresist, for example. The patterned photoresist layer 116 only requires a thickness between 600 angstroms and 2200 angstroms, preferably about 1500 angstroms. The patterned photoresist layer 116 has a larger share contact opening pattern 120 and a smaller square contact opening pattern 122. The share contact opening pattern 120 is disposed over a portion of the gate structure 104 and a portion of the source/drain region 108 of the same MOS transistor 102. The square contact opening pattern 122 is disposed over a portion of the source/drain region 108 of another MOS transistor 102. Sizes of the share contact opening pattern 120 and the square contact opening pattern 122 are after-development-inspection critical dimensions (ADI CDs) of the share and square contact openings.

Figure 1E:
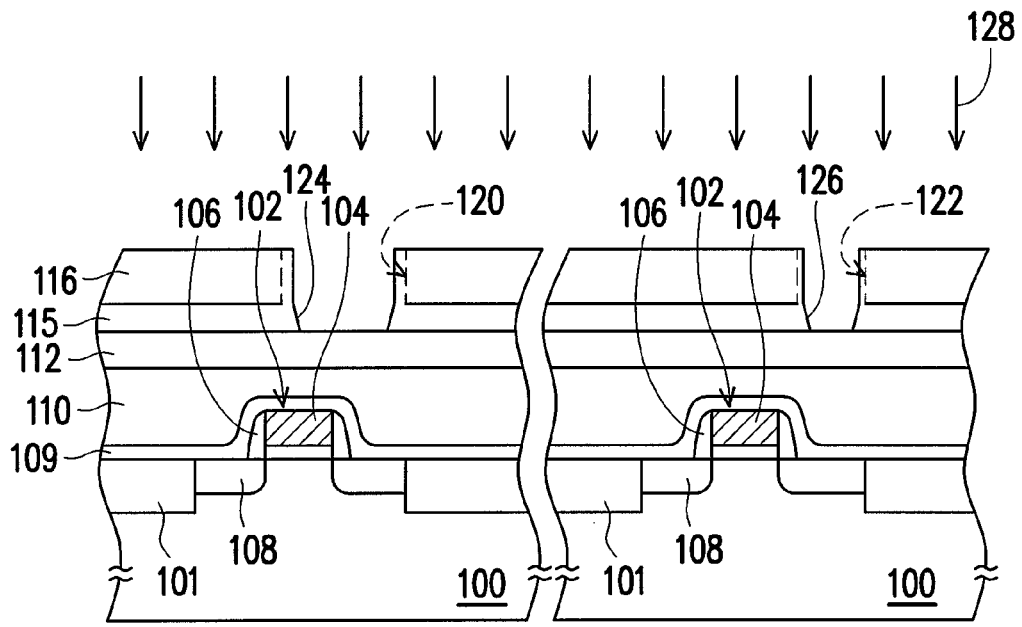

Afterwards, referring to FIG. 1E, the patterned photoresist layer 116 is used as an etching mask to perform an etching step 128. The share contact opening pattern 120 and the square contact opening pattern 122 are transferred to the Si-containing material layer 114 thereunder so as to form a patterned Si-containing material layer 115. In the aforementioned etching step 128, a induced fluorinated hydrogen compound ($CH_xF_y$, x=1, 2, 3; y=1, 2, 3) is adopted as an etching gas, such as $CHF_3$, $CH_3F$, $CH_2F_2$ or any mixed gas of the foregoing, such that when the Si-containing material layer 114 is etched, deposition of a polymer layer occurs simultaneously as well. Consequently, opening patterns 124 and 126 having tapered sidewalls can be etched in a patterned Si-containing material layer 115 to correspond to the share contact opening pattern 120 and the square contact opening pattern 122 respectively. Moreover, since the size of the share contact opening pattern 120 is larger than that of the square contact opening pattern 122, polymer layers stacked on the sidewalls the opening pattern 124 and the share contact opening pattern 120 are more than polymer layers stacked on the sidewalls of the opening pattern 126 and the square contact opening pattern 122. In other words, a dimension difference between the opening pattern 124 and the share contact opening pattern 120 is larger than a dimension difference between the opening pattern 126 and the square contact opening pattern 122.

In view of the above-mentioned, an etching recipe of the etching step 128 can render the sizes of the opening patterns 124 and 126 smaller than those of the share contact opening pattern 120 and the square contact opening pattern 122. Meanwhile, a range of the size reduction of the share contact opening pattern 120 and the square contact opening pattern 122 can be controlled by properly adjusting etching parameters of the etching step 128, such a flow rate of the etching gas.

Next, the patterned photoresist layer 116, the patterned Si-containing material layer 115 and polymer layers of the foregoing layers may be used as masks to etch the etching resistive layer 112 so as to at least remove a portion of the etching resistive layer 112 exposed by the opening patterns 124 and 126 and form a patterned etching resistive layer.

Figure 1F:
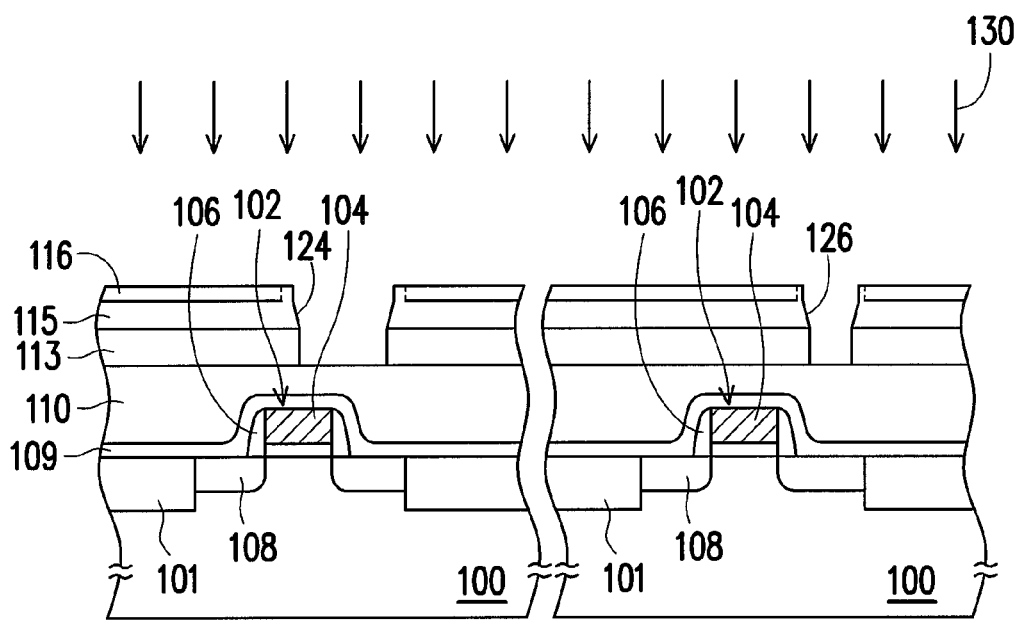
Figure 1G:
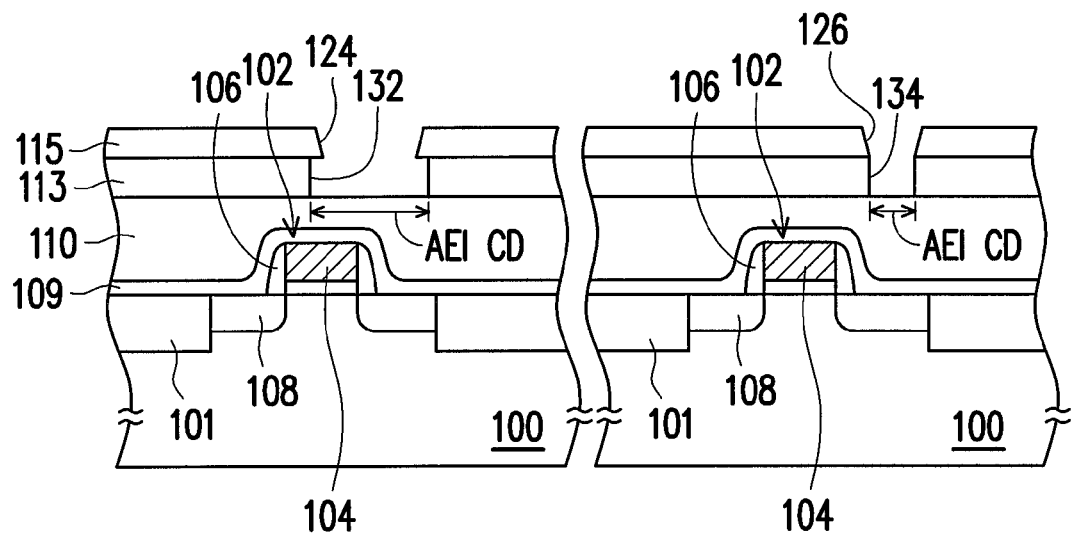

An etching speed is affected by different sizes of opening patterns, and accordingly, an opening pattern having a relatively larger size would render an etching speed relatively faster. As shown in FIG. 1F, when the etching resistive layer 112 on a bottom of the opening pattern 124 is etched until the dielectric layer 110 is exposed, the etching resistive layer 112 exposed by a bottom of the opening pattern 126 is not yet completely removed. At this moment, a portion of the patterned photoresist layer 116 is also consumed (not shown). Therefore, as shown in FIG. 1G, in a step 130, an over-etching process is performed in the etching resistive layer 112 on a bottom of the opening pattern 126 until the dielectric layer 110 is exposed. Whereas the etching resistive layer 112 on a bottom of the opening pattern 124 is expanded so that opening patterns 132 and 134 corresponding to the opening patterns 124 and 126 are formed in a patterned etching resistive layer 113, and the patterned photoresist layer 116 is removed simultaneously. Also, sizes of the opening patterns 132 and 134 can be controlled by properly adjusting the etching parameters of the etching step 130, such as etching time.

Figure 1H:
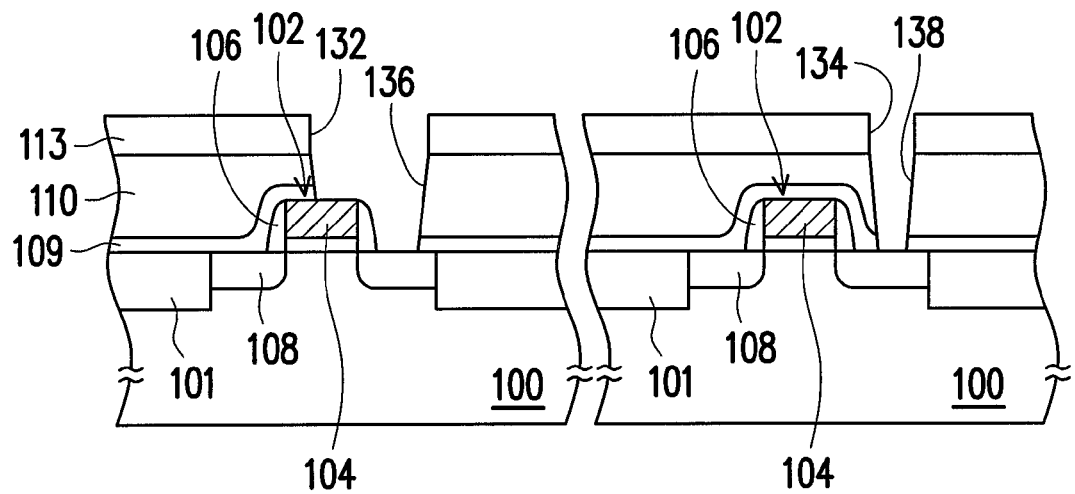

Afterwards, referring to FIG. 1H, after the opening patterns 132 and 134 are formed, $CF_4/O_2$ mixture gas is applied to etch the etching resistive layer 113 for pattern and simultaneously remove the patterned Si-containing material layer 115. Then, the patterned etching resistive layer 113 is adopted as a mask to perform an etching step so that a share contact opening 136 exposing a portion of the gate structure 104 and a portion of the source/drain region 108 of an MOS transistor 102 and a square contact opening 138 exposing a portion of the S/D region 108 of another MOS transistor 102 are formed in the dielectric layer 110 and a contact etching stopper layer 109.

The sizes of the opening patterns 136 and 138 are the AEI-CDs of the share contact opening pattern 120 and the square contact opening pattern 122, approximately equal to sizes of contact openings pre-formed subsequently. Differences obtained from the sizes of the share contact opening pattern 120 and the square contact opening pattern 122 and the sizes of the opening patterns 136 and 138 serve as a first dimension difference and a second dimension difference. A ratio of the second dimension difference to the first dimension difference is the ADI-AEI CD difference ratio thereof.

During the above fabricating process, the ADI-AEI CD difference ratio of the two types of contact openings is controlled by the etching parameters of the step 128 of etching the Si-containing material layer 114 and by the etching parameters of the step 130 of etching the etching resistive layer 112. For example, in the etching step 128, the sizes of the opening patterns 124 and 126 are indirectly controlled by adjusting a flow rate of a gas containing a fluorinated hydrocarbon compound to control a thickness of a polymer layer. In the etching step 130, the sizes of the opening patterns 132 and 134 are controlled by adjusting the etching times, namely etching amounts. Hence, by properly selecting the parameters for the etching steps 128 and 130, the ADI-AEI CD difference ratios can be controlled within a range allowed by a fabricating process so that problems such as mismatching of contacts, overly small contact areas with elements, or no contact with elements in the contacts subsequently formed are avoided and thereby significantly improving the reliability of the fabricating process.

Additionally, in the method, the etching parameters of the aforementioned two etching steps are adjusted to make loading effects of deposition and etching compensated and thus to control the ADI-AEI CD difference ratios of the openings having different sizes so that the photomasks adopted during the fabricating process need not be amended accordingly and the fabricating cost is thus reduced.

Moreover, after the share contact opening 136 and the square contact opening 138 are formed, the subsequent fabricating process can be continued to form share contacts and square contacts (not illustrated). For example, the patterned etching resistive layer 113 may be removed, and a conductive material is further filled in the contact openings 136 and 138 and excessive conductive material is removed until a surface of the dielectric layer 110 is exposed.

According to one embodiment, the etching parameters may also be adjusted to render the step 130 of etching the etching resistive layer 112 as a just-etching step and the etching resistive layer 112 is simultaneously etched until the dielectric layer 110 is exposed so that a substantially perpendicular opening pattern (not illustrated) is formed in the patterned etching resistive layer 113. The etching gas used in the etching step 130 is, for example, $CF_4$, CO and $O_2$. Certainly, in such a situation, the etching parameters of the step 128 of etching the Si-containing material layer 114 may also be adjusted depending on requirements of the fabricating process and thereby rendering the ADI-AEI CD difference ratio thereof within a range allowed by the fabricating process.

Additionally, in other embodiments, the etching parameters may be further adjusted so that the step 130 of etching the etching resistive layer 112 is first performing an under-etching step of removing only a portion of the etching resistive layer 112 exposed by the bottoms of the opening patterns 124 and 126 and leaving a residual etching resistive layer 112 on the bottoms of the opening patterns 124 and 126. In one embodiment, the etching gas used in the under-etching step is, for example, $CF_4$, CO and $O_2$. Afterwards, an over-etching step having a low selectivity ratio is further performed to completely etch the residual etching resistive layer 112 remaining on the bottoms of the opening patterns 124 and 126 and a portion of the dielectric layer thereunder. The over-etching step having a low selectivity ratio can render the etching process as an anisotropic etching process. The etching gas adopted in the process is, for example, a fluorinated gas, such as $CF_4$. Similarly, in such a situation, the etching parameters of the step 128 of etching the Si-containing material layer 114 may be further adjusted depending on requirements of the fabricating process and thereby rendering the ADI-AEI CD difference ratio within a range allowed by the process.

Figure 2:
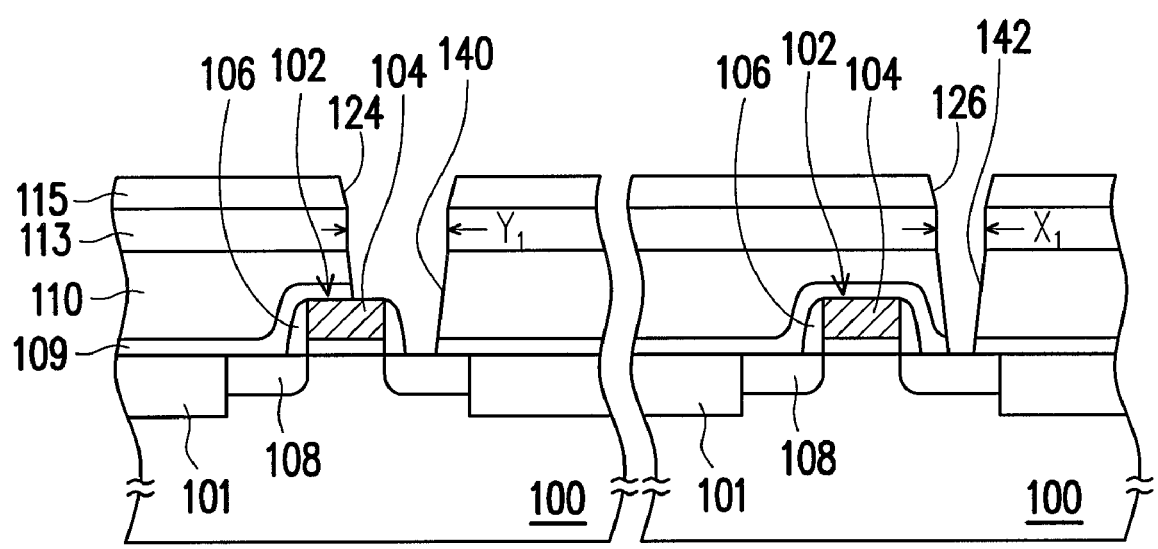
FIG. 2 is a cross-sectional view illustrating the result of a fabricating process of contact openings, namely the result of having the structure in FIG. 1F directly subjected to the contact opening etching process illustrated in FIG. 1H.

FIG. 2 is a cross-sectional view illustrating the result of a fabricating process of contact openings, namely the result of having the structure of FIG. 1F directly subjected to the contact opening etching process illustrated by FIG. 1H.

As shown in FIG. 2, without the over-etching step shown in FIG. 1G, the size (AEI CD) $Y_1$ of the share contact opening 140 is smaller than that of the share contact opening 136 in FIG. 1H, while the size (AEI CD) $X_1$ is substantially the same as that of the square contact opening 138. Therefore, as compare with the above embodiment of this invention, the ADI-AEI CD difference of the share contact opening is larger while that of the square contact opening is substantially not changed.

Figure 3A:
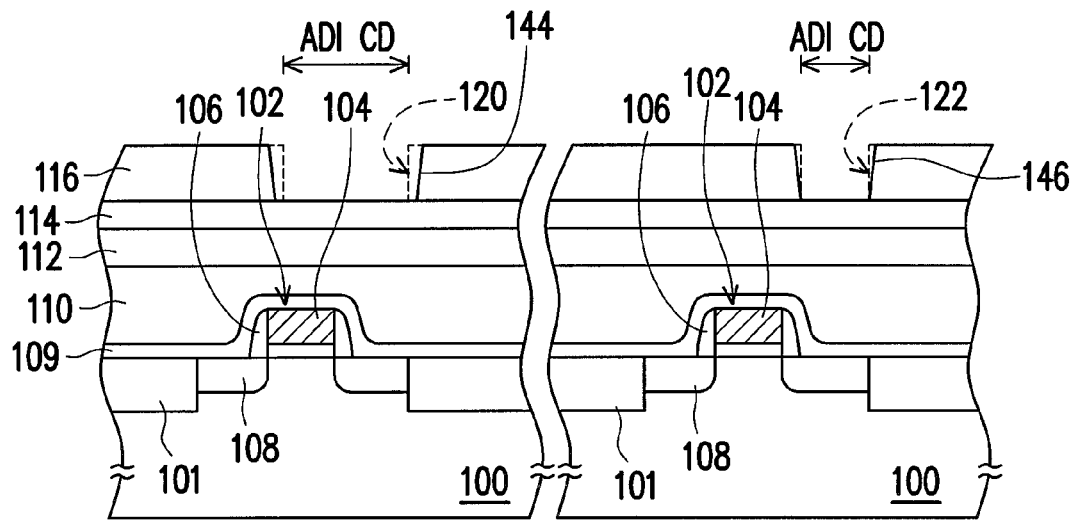
FIGS. 3A through 3C are cross-sectional views illustrating a later part of a fabricating process flowchart of contact openings according to a first embodiment of the present invention, wherein the earlier part of the fabricating process is illustrated by FIGS. 1A-1D and described in related paragraphs.
Figure 3B:
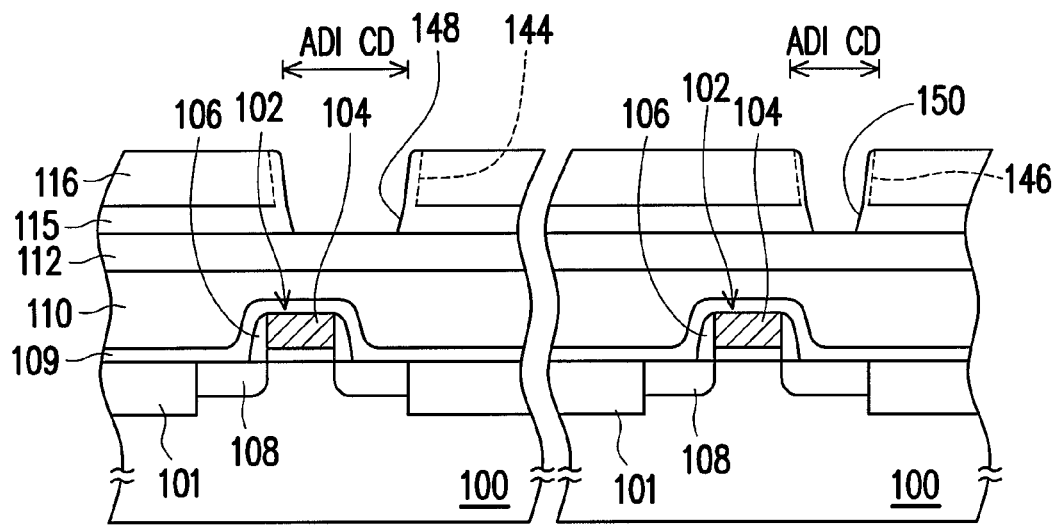
Figure 3C:
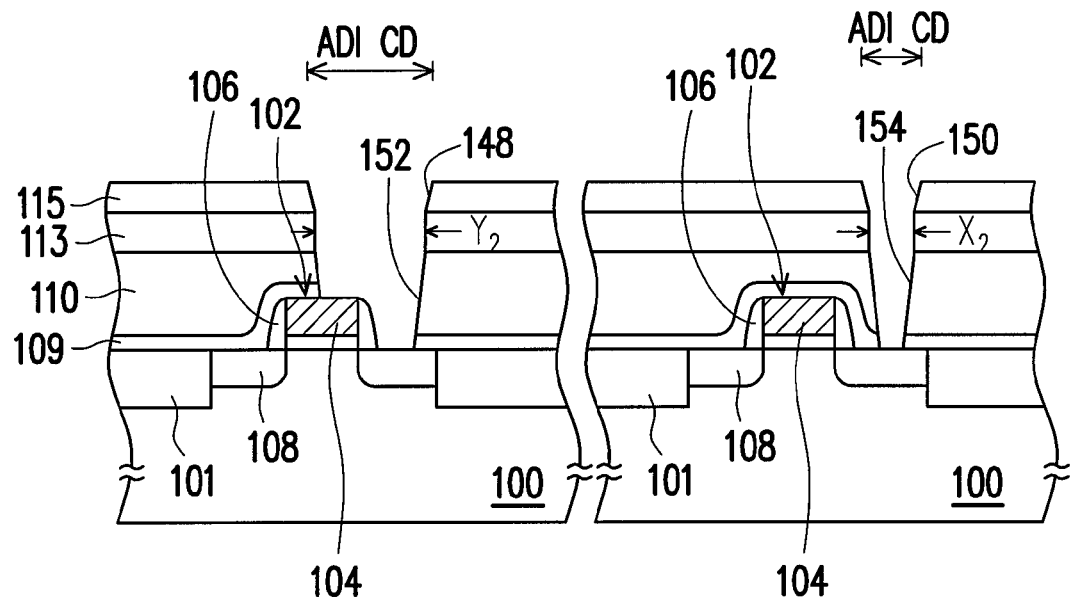

FIGS. 3A through 3C are cross-sectional views illustrating a later part of a fabricating process flowchart of contact openings according to the first embodiment of the present invention, wherein the earlier part of the fabricating process is illustrated by FIGS. 1A-1D and described in related paragraphs.

Referring to FIG. 3A, after the patterned photoresist layer 116 having therein a share contact opening pattern 120 and a square contact opening pattern 122 is formed, a trimming step is performed to it to form larger opening patterns 144 and 146. Since the share contact opening pattern 120 is larger than the square contact opening pattern 122, the sidewall of the former is trimmed more than that of the latter. Hence, the size difference between the contact opening patterns 120 and 144 is larger than that between the contact opening patterns 122 and 146. The trimming step may use $O_2$ and CO gases in gas flow rates of 40 and 100 sccm respectively to trim the photoresist, and may be conducted for 2-15 seconds.

Referring to FIG. 3B, a first etching step is performed using the trimmed photoresist layer 116 as a mask to pattern the Si-containing material layer 114 and form a patterned Si-containing material layer 115, wherein a polymer layer is formed on the sidewalls of the trimmed photoresist layer 116, i.e., the sidewalls of the opening patterns 144 and 146, and the sidewalls of the patterned Si-containing material layer 115. Since the opening pattern 144 is larger than the opening pattern 146, the polymer layer formed on the sidewall of the former is thicker than that formed on the sidewall of the latter. The first etching step with polymer generation may use the same recipe of the first etching step illustrated in FIG. 1E and described in the related paragraphs. Thus, opening patterns 148 and 150 having tapered sidewalls are present in the patterned Si-containing material layer 115, corresponding to the share contact opening pattern 120 and the square contact opening pattern 122 respectively.

Referring to FIG. 3C, a second etching step is performed using the trimmed photoresist layer 116, the patterned Si-containing material layer 115 and the polymer layer as masks, so as to remove the exposed portions of the etching resistive layer 112 and the target material layer 110 and form a patterned etching resistive layer 113 as well as a share contact opening 152 and a square contact opening 154 in the target material layer 110. The second etching step may use the same recipes for removing the exposed portions of the etching resistive layer 112 (see FIG. 1F) and the exposed portions of the target material layer 110 (see FIG. 1H) in the embodiment of FIGS. 1A-1H.

Since the above photoresist trimming step expands the share contact opening pattern 120 considerably, the size (AEI CD) $Y_2$ of the share contact opening 152 is larger than that ($Y_1$) of the share contact opening 140 in FIG. 2 of the prior art, while the size (AEI CD) $X_2$ of the square contact opening 154 is substantially the same as that ($X_1$) of the square contact opening 142 in FIG. 2. Accordingly, the ADI-AEI CD difference of the share contact opening is decreased while that of the square contact opening is substantially not changed, which decreases the ADI-AEI CD difference ratio defined as the ratio of the ADI-AEI CD difference of the share contact opening pattern to the ADI-AEI CD difference of the square contact opening pattern. In general, such ADI-AEI CD difference ratio is larger than one.

In the above process, at least one parameter among the trimming parameters of the trimming step and the etching parameters of the first etching step can be adjusted to obtain a predetermined ADI-AEI CD difference ratio. For example, as a relatively smaller ADI-AEI CD difference ratio is desired, it is feasible to increase the trimmed amount of the photoresist without varying other parameters so that the ADI-AEI CD difference of the share contact opening pattern is further decreased to further decrease the ADI-AEI CD difference ratio.

Figure 4A:
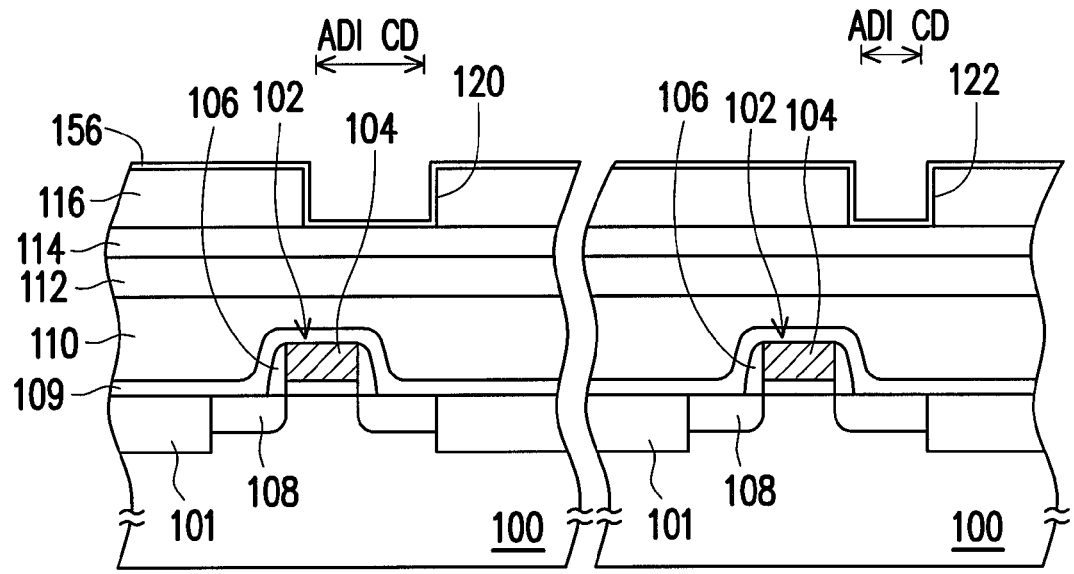
FIGS. 4A through 4C are cross-sectional views illustrating a later part of a fabricating process flowchart of contact openings according to a second embodiment of the present invention, wherein the earlier part of the fabricating process is illustrated by FIGS. 1A-1D and described in related paragraphs.
Figure 4B:
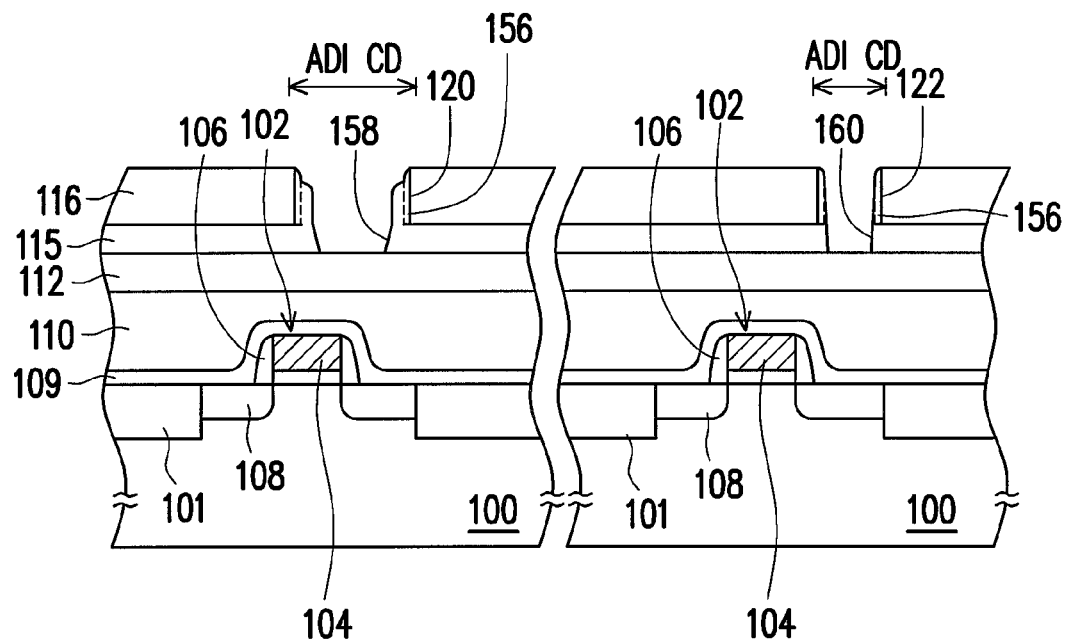
Figure 4C:
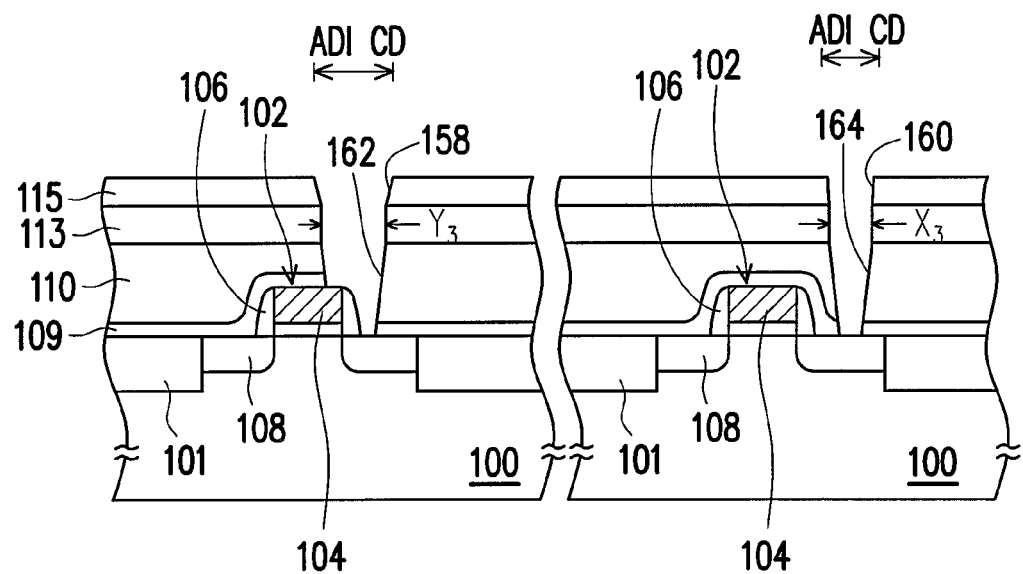

FIGS. 4A through 4C are cross-sectional views illustrating a later part of a fabricating process flowchart of contact openings according to the second embodiment of the present invention, wherein the earlier part of the fabricating process is illustrated in FIGS. 1A-1D and described in the related paragraphs.

Referring to FIG. 4A, after the patterned photoresist layer 116 having therein a share contact opening pattern 120 and a square contact opening pattern 122 is formed, a substantially conformal polymer layer 156 is deposited on the photoresist layer 116 and in the share contact opening pattern 120 and the square contact opening pattern 122.

Referring to FIG. 4B, a first etching step is performed using the patterned photoresist layer 120 and the polymer layer 156 on the sidewalls of the share contact opening pattern 120 and the square contact opening pattern 122 as masks, so as to pattern the Si-containing material layer 114 and form a patterned Si-containing material layer 115, wherein another polymer layer is formed on the sidewalls of the polymer layer 156 and the patterned Si-containing material layer 115. Since the opening pattern 120 is larger than the opening pattern 122, the polymer layer formed on the sidewall of the former is thicker than that formed on the sidewall of the latter. The first etching step with polymer generation in this embodiment may use the same recipe of the first etching step illustrated in FIG. 1E and described in related paragraphs, as in the above first embodiment. Thus, opening patterns 158 and 160 with tapered sidewalls are present in the patterned Si-containing material layer 115, corresponding to the share contact opening pattern 120 and the square contact opening pattern 122 respectively.

Referring to FIG. 4C, a second etching step is performed using the patterned photoresist layer 116, the polymer layer 156, the patterned Si-containing material layer 115 and the polymer layer on the sidewalls of the polymer layer 156 and the patterned Si-containing material layer 115 as masks, so as to remove the exposed portions of the etching resistive layer 112 and the target material layer 110 and form a patterned etching resistive layer 113 as well as a share contact opening 162 and a square contact opening 164 in the target material layer 110. The second etching step may use the same recipes for removing the exposed portions of the etching resistive layer 112 (see FIG. 1F) and the exposed portions of the target material layer 110 (see FIG. 1H) in the embodiment of FIGS. 1A-1H.

Since the polymer layer 156 causes size reduction to the share contact opening pattern but substantially not to the square contact opening pattern, as shown in FIG. 4B, the size (AEI CD) $Y_3$ of the share contact opening 162 is smaller than that ($Y_1$) of the share contact opening 140 in FIG. 2 of the prior art, while the size (AEI CD) $X_3$ of the share contact opening 164 is substantially the same as that ($X_1$) of the square contact opening 142 in FIG. 2. Accordingly, the ADI-AEI CD difference of the share contact opening pattern is increased while that of the square contact opening is substantially not changed, which increases the ADI-AEI CD difference ratio.

In the above process, at least one parameters among the deposition parameters of the step of depositing the polymer layer 156 and the etching parameters of the first etching step can be adjusted to obtain a predetermined ADI-AEI CD difference ratio. For example, as a relatively larger ADI-AEI CD difference ratio is desired, it is feasible to increase the thickness of the polymer layer 156 without varying other parameters so that the ADI-AEI CD difference of the share contact opening pattern is further increased to further increase the ADI-AEI CD difference ratio.

Moreover, though in the above embodiments the etching resistive layer 112 and the Si-containing material layer 114 are exemplified as an I-line photoresist layer and a Si-containing hard-mask bottom anti-reflection coating (SHB) layer respectively, they may alternatively comprise amorphous carbon and a dielectric anti-reflection coating (DARC) respectively. The DARC may comprise silicon oxide and silicon oxynitride (SiON). Such a combination of the materials of the etching resistive layer 112 and the Si-containing material layer 114 is suitable for a patterned photoresist layer 116 that comprises a 193 nanometer photoresist, because their etching selectivities are good enough. Moreover, in such a case, a bottom anti-reflection coating (BARC) may optionally be formed before the patterned photoresist layer 116 is formed.

In summary, the method disclosed by the present invention can control the ADI-ADI CD difference ratios of openings having different sizes within a range allowed by the fabricating process so that the problems of mismatching, overly small contact areas with elements or no contact with elements in the contacts formed subsequently are avoided, and thereby significantly improving the reliability of the fabricating process. In another aspect, in the method of the present invention, the photomasks are not required to be amended to achieve the purpose of controlling the ADI-AEI CD difference ratios of openings having different dimensions. As a result, the fabricating cost is reduced.

Although the present invention has been disclosed above by the preferred embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A method for controlling an ADI-AEI CD difference ratio of openings having different sizes, wherein the openings are formed with steps comprising:
    forming an etching resistive layer, an Si-containing material layer and a patterned photoresist layer on a target material layer in sequence, wherein the patterned photoresist layer has therein a first opening pattern and a second opening pattern with different sizes, and the size of the first opening pattern is larger than the size of the second opening pattern; and
    performing steps of etching the Si-containing material layer, the etching resistive layer and the target material layer in sequence to form a first opening and a second opening respectively corresponding to the first opening pattern and the second opening pattern in the target material layer, wherein a difference between a size of the first opening and a size of the first opening pattern is a first dimension difference, a difference between a size of the second opening and a size of the second opening pattern is a second dimension difference, and a ratio of the first dimension difference to the second dimension difference is called an ADI-AEI CD difference ratio,
the method comprising:
    performing a trimming step to the patterned photoresist layer before the steps of etching the Si-containing material layer, the etching resistive layer and the target material layer;
    performing a first etching step using the trimmed photoresist layer as a mask to pattern the Si-containing material layer and form a patterned Si-containing material layer, wherein a polymer layer is formed on sidewalls of the trimmed photoresist layer and the patterned Si-containing material layer;
    performing a second etching step using the trimmed photoresist layer, the patterned Si-containing material layer and the polymer layer as masks, so as to remove exposed portions of the etching resistive layer and the target material layer; and
    adjusting at least one parameter among trimming parameters of the trimming step and etching parameters of the first etching step, so as to obtain a predetermined ADI-AEI CD difference ratio.

2. The method of claim 1, wherein at least one trimming parameter is adjusted, and the at least one trimming parameter comprises a trimmed amount of photoresist.

3. The method of claim 1, wherein at least one etching parameter is adjusted, and the at least one etching parameter comprises a flow rate of etching gas.

4. The method of claim 1, wherein the first opening is a share contact opening, and the second opening is a square contact opening.

5. The method of claim 1, wherein the etching resistive layer comprises an I-line photoresist.

6. The method of claim 1, wherein the etching resistive layer comprises amorphous carbon.

7. The method of claim 1, wherein the Si-containing material layer comprises an Si-containing hard-mask bottom anti-reflection coating (SHB) layer.

8. The method of claim 1, wherein the Si-containing material layer comprises a dielectric anti-reflection coating (DARC).

9. The method of claim 1, wherein the patterned photoresist layer comprises a 193 nanometer photoresist.

10. The method of claim 1, wherein the target material layer comprises a dielectric layer.

11. A method for controlling an ADI-AEI CD difference ratio of openings having different sizes, wherein the openings are formed with the steps comprising:
    forming an etching resistive layer, an Si-containing material layer and a patterned photoresist layer on a target material layer in sequence, wherein the patterned photoresist layer has therein a first opening pattern and a second opening pattern with different sizes, and the size of the first opening pattern is larger than the size of the second opening pattern; and
    performing steps of etching the Si-containing material layer, the etching resistive layer and the target material layer in sequence to form a first opening and a second opening respectively corresponding to the first opening pattern and the second opening pattern in the target material layer, wherein a difference between a size of the first opening and a size of the first opening pattern is a first dimension difference, a difference between a size of the second opening and a size of the second opening pattern is a second dimension difference, and a ratio of the first dimension difference to the second dimension difference is called an ADI-AEI CD difference ratio,
the method comprising:
    depositing a substantially conformal first polymer layer over the patterned photoresist layer and in the first and the second opening patterns before the steps of etching the Si-containing material layer, the etching resistive layer and the target material layer;

performing a first etching step using the patterned photoresist layer and the first polymer layer on sidewalls of the first and the second opening patterns as masks to pattern the Si-containing material layer and form a patterned Si-containing material layer, wherein a second polymer layer is formed on sidewalls of the first polymer layer and the patterned Si-containing material layer;

performing a second etching step using the patterned photoresist layer, the first polymer layer, the patterned Si-containing material layer and the second polymer layer as masks, so as to remove exposed portions of the etching resistive layer and the target material layer; and adjusting at least one parameter among deposition parameters of the step of depositing the first polymer layer and etching parameters of the first etching step, so as to obtain a predetermined ADI-AEI CD difference ratio.

12. The method of claim 11, wherein at least one deposition parameter is adjusted, and the at least one deposition parameter comprises thickness of the first polymer layer.

13. The method of claim 11, wherein at least one etching parameter is adjusted, and the at least one etching parameter comprises a flow rate of etching gas.

14. The method of claim 11, wherein the first opening is a share contact opening and the second opening is a square contact opening.

15. The method of claim 11, wherein the etching resistive layer comprises an I-line photoresist.

16. The method of claim 11, wherein the etching resistive layer comprises amorphous carbon.

17. The method of claim 11, wherein the Si-containing material layer comprises an Si-containing hard-mask bottom anti-reflection coating (SHB) layer.

18. The method of claim 11, wherein the Si-containing material layer comprises a dielectric anti-reflection coating (DARC).

19. The method of claim 11, wherein the patterned photoresist layer comprises a 193 nanometer photoresist.

20. The method of claim 11, wherein the target material layer comprises a dielectric layer.

* * * * *